US012282078B2

(12) United States Patent
Saleh et al.

(10) Patent No.: US 12,282,078 B2
(45) Date of Patent: Apr. 22, 2025

(54) MULTI-RESONANCE BROADBAND TRANSMIT/RECEIVE SWITCHES WITHOUT TUNING USED IN MAGNETIC RESONANCE IMAGING

(71) Applicant: Imam Abdulrahman Bin Faisal University, Dammam (SA)

(72) Inventors: Gameel Saleh Mohammed Saleh, Dammam (SA); Ashraf Abuelhaija, Amman (JO)

(73) Assignee: Imam Abdulrahman Bin Faisal University, Dammam (SA)

( * ) Notice: Subject to any disclaimer, the term of this patent is extended or adjusted under 35 U.S.C. 154(b) by 173 days.

(21) Appl. No.: 17/882,075

(22) Filed: Aug. 5, 2022

(65) Prior Publication Data
US 2024/0045007 A1 Feb. 8, 2024

(51) Int. Cl.
*G01R 33/36* (2006.01)
*H04B 1/44* (2006.01)

(52) U.S. Cl.
CPC ........... *G01R 33/3614* (2013.01); *H04B 1/44* (2013.01)

(58) Field of Classification Search
CPC ........... G01R 33/3614; G01R 33/3635; G01R 33/3664; H04B 1/44
See application file for complete search history.

(56) References Cited

U.S. PATENT DOCUMENTS

| 5,296,814 A * | 3/1994 | Lyle .................. G01R 33/3628 324/322 |
| 7,135,941 B1 * | 11/2006 | Tsironis .................... H01P 5/04 333/263 |
| 10,623,075 B2 * | 4/2020 | Pratt .................... H04B 7/0617 |
| 11,416,657 B2 * | 8/2022 | Rautio .................... G06F 30/20 |
| 11,973,057 B2 * | 4/2024 | Balboni ................. H01L 24/16 |

(Continued)

OTHER PUBLICATIONS

Ahmed, et al. ; A Novel Butterfly-Shaped Multilayer Backward Microstrip Hybrid Coupler for Ultrawideband Applications ; Microwave and Optical Technology Letters, vol. 54, No. 10 ; Oct. 2012 ; 7 Pages.

(Continued)

*Primary Examiner* — Jermele M Hollington
*Assistant Examiner* — Zannatul Ferdous
(74) *Attorney, Agent, or Firm* — Oblon, McClelland, Maier & Neustadt, L.L.P.

(57) ABSTRACT

A magnetic resonance imaging (MRI) apparatus that includes a multi-resonance transmit/receive (T/R) switch, one switch design having a top side and a bottom side of a microstripline based hybrid coupler, a first pin diode, a second pin diode, four vertical transmission lines and six horizontal transmission lines arranged in a bended manner on the microstripline. The top side is associated with a first port and a second port, and electrically connected to the first pin diode and the second pin diode. The bottom side is associated with a third port and a fourth port, and electrically connected with the first pin diode and the second pin diode. The switch receives radio frequency (RF) pulses of different frequencies transmitted to and received from an MRI RF coil where the different frequencies are received concurrently and without tuning by the multi-resonance T/R switch from the MRI RF coil.

11 Claims, 12 Drawing Sheets

(56) References Cited

U.S. PATENT DOCUMENTS

2010/0253462 A1    10/2010  Hardy et al.
2020/0295722 A1*   9/2020   Kato .................. H03F 3/45183

OTHER PUBLICATIONS

Letavin, et al. ; Compact Dual-Frequency Microstrip Branch-Line Coupler Using Artificial Transmission Lines ; 2018 19$^{th}$ International Conference of Young Specialists on Micro/Nanotechnologies and Electron Devices (EDM) ; Jun. 29-Jul. 3, 2018 ; Abstract Only ; 3 Pages.
Kabel ; Compact Quadrature Hybrid Coupler for MRI Coil ; Brodersen A/S ; Aug. 2 017 ; 5 Pages.
Abuelhaija, et al. ; Symmetrical and asymmetrical microstripline-based transmit/receive switches for 7-Tesla magnetic resonance imaging ; International Journal of Circuit Theory and Application, vol. 49, Issue 7 ; pp. 2082-2093 ; Apr. 12, 2021 ; Abstract Only ; 2 Pages.
Saleh, et al. ; Dual Tuned Switch for Dual Resonance 1H/13C MRI Coil ; 2021 IEEE International IOT, Electronics and Mechatronics Conference (IEMTRONICS) ; Apr. 21-24, 2021 ; Abstract Only ; 3 Pages.
Abuelhaija, et al. ; A Pi-Shaped Compact Dual Tuned 1H/23Na Microstripline-Based Switch for 7-Tesla MRI ; International Journal on Communications Antenna and Propagation, vol. 11, No. 1 ; 2021 ; Abstract Only ; 5 Pages.
Abuelhaija, et al. ; Multi- and dual-tuned microstripline-based transmit/receive switch for 7-Tesla magnetic resonance imaging ; International Journal of Imaging Systems and Technology vol. 32, Issue 2 ; Jul. 20, 2021 ; pp. 590-599 ; Abstract Only ; 2 Pages.
Abuelhaija, et al. ; T- and Cascaded Pi-Shaped 1H T/R Switches with Realistic Trace Width for 7 Tesla MRI ; International Journal on Communications Antenna and Propagation (IRECAP) vol. 12, No. 1 ; Jan. 2022 ; 7 Pages.

* cited by examiner

MULTI-RESONANCE BROADBAND TRANSMIT/RECEIVE SWITCHES WITHOUT TUNING USED IN MAGNETIC RESONANCE IMAGING

STATEMENT REGARDING PRIOR DISCLOSURE BY INVENTORS

Aspects of this technology are described by the present inventors in an article titled: "T- and Cascaded Pi-Shaped 1H T/R Switches with Realistic Trace Width for 7 Tesla MRI" published in International Journal on Communications Antenna and Propagation (IRECAP), Vol. 12 No. 1 on January 2022, which is incorporated herein by reference in its entirety.

BACKGROUND

Technical Field

The present disclosure relates to a magnetic resonance imaging (MRI) apparatus.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

In medical and clinical research fields, magnetic resonance imaging (MRI) is used to produce images of the inside of the human body. MRI employs powerful magnets which produce a strong magnetic field that forces protons in the human body to align with that field. When a radio-frequency (RF) current is applied through a RF coil the protons get stimulated and spin out of equilibrium straining against the pull of the magnetic field. When the radio-frequency current is turned off, the protons release energy to realign with the magnetic field. A plurality of MRI sensors is configured to detect the energy released by the protons and generate MR signals. Generated MR signals are processed to produce images, allowing examination of internal structures and/or biological processes within the body for diagnostic purposes.

There is a demand in healthcare industry for high-quality MRI scanners that produce images with high resolution, superior contrast, and high signal-to-noise (SNR) ratio. To meet the aforementioned criteria, the MRI scanners require magnets with higher strength, which in turn increase the radio frequency (RF) power required to excite atoms, such as hydrogen atoms, at a corresponding resonant frequency. The higher the strength of the magnet in the MRI scanner, higher the speed of precession of atomic nuclei, leading to an increase in the resonant frequency of an RF coil and the energy required to excite spins. The demand for higher RF power may be met using RF power amplifiers with high output signal levels. However, the RF power amplifiers are typically located in an equipment room several meters away from the MRI scanner. The transfer of power requires long RF transmission line cables to reach the MRI scanner from the equipment rooms to feed the RF coil. Having long cables increases insertion loss and reduces a power delivered to the RF coils. One solution is to reduce the insertion losses due to the transmission line cable is by having a near-magnet power amplifier using non-magnetic components and placing the near-magnet power amplifier behind the MRI scanner within an MRI room. However, such solutions may reduce the insertion losses marginally but also introduces other issues such as space and efficiency issues.

U.S. Patent Publication No. 2004/0266362A1 to Watkins et al. is in the field of a a transmit/receive (T/R) switch operating over a range of frequencies to implement a transmit/receive switch having a low loss path during the transmit mode and the receiver mode, however this T/R switch can just handle one resonant frequency and does not disclose a multi-tuning T/R switch. In addition, reduction of insertion loss of a circuit based on microstripline (MSL) based hybrid couplers is also not disclosed. US Patent Publication No. 2018/0083591A1 to Mandegaran is in the field of a RF duplexer including quadrature hybrid couplers and RF filters to enhance isolation in hybrid-based RF duplexers and multiplexers, however utilizing RF filters in MRI scanners increases noise in circuitry which is undesirable.

In present MRI systems, RF coils are configured to operate in transmit, receive, and transceiver modes in MRI applications. The RF coils operate in a fixed tuned condition and a fixed impedance matched condition. The RF coils are designed, manufactured, and used to be "one size fits all." However, as the size, shape, and position of the human body are not the same, the human body does not present the same electrical load to the fixed RF coils. Therefore, tuning is required to tune RF coils according to each human body to provide matching impedance. If an RF coil resonates at two frequencies (corresponding to two different speeds of atomic nuclei like 1H, and 23Na), a dual tuned switch must be designed to handle this signal to/from the RF coil. These types of switches are already available and included in previous designs by the present inventors. See: Abuelhaija, A., Saleh, G., Baldawi, T., & Salama, S. (2021). Symmetrical and asymmetrical microstripline-based transmit/receive switches for 7-Tesla magnetic resonance imaging. International Journal of Circuit Theory and Applications, 49(7), 2082-2093. DOI: 10.1002/cta.3013 incorporated herein by reference. See also: G. Saleh and A. Abuelhaija, "Dual Tuned Switch for Dual Resonance 1H/13C MRI Coil," 2021 IEEE International IOT, Electronics and Mechatronics Conference (IEMTRONICS), 2021, pp. 1-7, DOI: 10.1109/IEMTRONICS52119.2021.9422627 incorporated herein by reference. See also Abuelhaija, A., Saleh, G., A Pi-Shaped Compact Dual Tuned 1H/23Na Microstripline-Based Switch for 7-Tesla MRI, (2021) International Journal on Communications Antenna and Propagation (IRECAP), 11 (1), pp. 57-64. DOI: 10.15866/irecap.v11i1.20302 incorporated herein by reference. See also Abuelhaija, A., Saleh, G., Nashwan, O., Issa, S., & Salama, S. (2021). Multi- and dual-tuned microstripline-based transmit/receive switch for 7-Tesla magnetic resonance imaging. International Journal of Imaging Systems and Technology, DOI: 10.1002/ima.22634 incorporated herein by reference.

The differences between the classical types of T/R switches in the literature and MSL-based switches is explained in a previous patent application [see Abuelhaija, A., Saleh, G, application Ser. No. 17/307,595, Filling Date: May 4, 2021] which is incorporated herein by reference.

At higher $B_0$ fields and $B_1$ frequencies, coil tuning and matching become more critical. Transmit/Receive (T/R) switches are used in the MRI systems to handle the propagation of Radio Frequency (RF) pulses to/from RF coils that transmit these RF pulses into the body or receive the irradiated signals from the body and pass them to a receiver, through the T/R switch, to reconstruct the image. The available T/R switches can transmit/receive pulses of a single frequency to/from the RF coil. If it is required that the RF coil resonates at two frequencies, a dual-tuned switch must be designed to handle such signal to/from the RF coil.

Hence, there is a need for a T/R switch that avoids cumbersome tuning, matching, and adjustments thereto that enhance the operational characteristics of the MRI system and the subject being imaged.

SUMMARY

The switches (e.g., T/R switches having 4 branches and 2 sections) of the present disclosure have the capability to transmit/receive RF pulses of many resonant frequencies to/from RF coils. These resonances are falling within two broadbands where the speed of the -nuclei (such as 1H, 23Na, 13C, 31P, 7Li, 19F) exist. This enables the multi-tuned switches of the present disclosure to transmit/receive RF pulses of different frequencies to/from multi-resonance RF coil(s) at the same time, and without tuning. If the coils can resonate at the same bands of the switch, there will be neither need to change the type of the coil (during detection of different diseases) nor to move the patient. The introduced switches will minimize artifacts thereby improving the quality of the scanned image and drastically reducing costs.

In an exemplary embodiment, a magnetic resonance imaging (MRI) switching apparatus for magnetic resonance imaging is described. The MRI apparatus includes a multi-resonance transmit/receive (T/R) switch. The multi-resonance transmit/receive (T/R) switch includes a top side and a bottom side of a microstripline based hybrid coupler, a first pin diode, a second pin diode, four vertical transmission lines arranged in a bended manner and six horizontal transmission lines arranged in a bended manner on the microstripline, wherein the top side of the microstripline is associated with a first port and a second port, and also electrically connected to the first pin diode and the second pin diode and wherein the bottom side is associated with a third port and a fourth port, and the bottom side also electrically connected with the first pin diode and the second pin diode, and wherein the multi-resonance transmit/receive (T/R) switch is optimized to receive RF pulses of different frequencies that are transmitted to and received from an MRI RF wherein the different frequencies are received concurrently and without tuning by the multi-resonance transmit/receive (T/R) switch from the MRI RF coil.

In another exemplary embodiment, a magnetic resonance imaging (MRI) apparatus for magnetic resonance imaging is described. The MRI apparatus includes a multi-resonance transmit/receive (T/R) switch. The multi-resonance transmit/receive (T/R) switch includes a top side and a bottom side of a microstripline (MSL) based hybrid coupler, two pin diodes, three vertical transmission lines arranged in a bended manner on the MSL based hybrid coupler, four horizontal transmission lines arranged in a bended manner on the MSL based hybrid coupler, an inverter electrically connected to the middle vertical transmission line, four ports on the top side and the bottom side of the MSL, and two pin diodes wherein each of the diodes are electrically connected to the top side and the bottom side of the MSL based hybrid coupler, wherein the MSL based hybrid coupler is optimized to receive RF pulses of different frequencies on one of the ports and transmit to a MRI RF coil through a second port wherein the different frequencies are transmitted and received concurrently and without tuning by the multi-resonance transmit/receive (T/R) switch to and from a MRI RF coil, and wherein the MSL is configured to accept RF radio pulses on one of the ports and transmit RF signals through another port to an MRI RF coil.

In another exemplary embodiment, a method of transmitting radio frequency to an MRI RF coil from a microstripline based hybrid coupler T/R switch is described. The method includes forward biasing two pin diodes electrically connected to the microstripline based hybrid coupler. The method further includes receiving an RF input signal on one port of the microstripline based hybrid coupler T/R switch. The method further includes transmitting the RF input signal through a second port the of the microstripline based hybrid coupler T/R switch to the MRI RF coil The foregoing general description of the illustrative embodiments and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
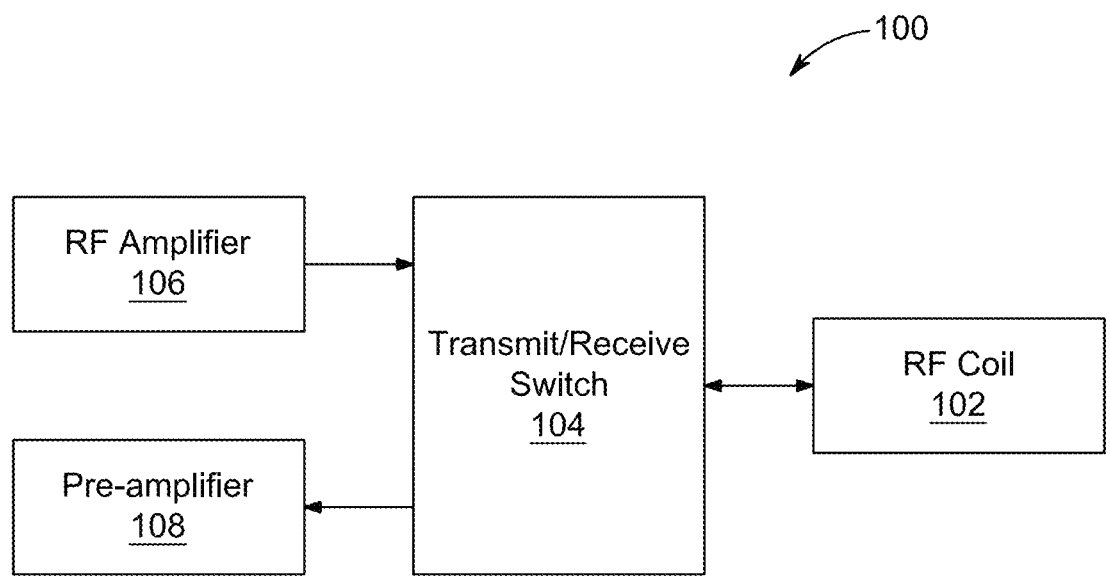
FIG. 1 is an exemplary schematic diagram of a RF system of a magnetic resonance imaging (MRI) apparatus, according to certain embodiments.

Reference will now be made in detail to specific embodiments or features, examples of which are illustrated in the accompanying drawings. Wherever possible, corresponding, or similar reference numbers will be used throughout the drawings to refer to the same or corresponding parts. Moreover, references to various elements described herein, are made collectively or individually when there may be more than one element of the same type. However, such references are merely exemplary in nature. It may be noted that any reference to elements in the singular may also be construed to relate to the plural and vice-versa without limiting the scope of the disclosure to the exact number or type of such elements unless set forth explicitly in the appended claims.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

A number of different shapes and forms of Magnetic Resonance Imagers (MRIs) are in use, most having an annular form, with the patient being imaged in the central aperture which extends through the length of the machine. A known imaging system comprises a magnetic gantry, a bore, a support apparatus, a patient couch, a base unit, and a couch support unit. Both the base unit and the couch support contain gears in order to position the patient. Some MRI imagers have an imaging volume characterized by an open gap bracketed by large plates either on both sides of the patient or on top and underneath the patient. The presently described technology and the invention applies to imagers of all types.

In magnetic resonance acquisitions, it is often useful to have a radio frequency coil disposed with or near the subject during imaging. Such proximate positioning of a radio frequency coil used for transmitting a magnetic resonance excitation signal, for receiving a magnetic resonance signal, or both, substantially improves radio frequency coupling between the radio frequency coil and the subject.

Aspects of the present disclosure are directed to a magnetic resonance imaging (MRI) apparatus for magnetic resonance imaging and a method of transmitting radio frequency (RF) to an MRI RF coil from a microstripline based hybrid coupler transmit/receive (T/R) switch. The present disclosure discloses a broadband multi-resonance T/R switch based on microstripline (MSL) coupler technology. The disclosed broadband multi-resonance T/R switch provides enhanced performance in terms of heat dissipation, handling high power capabilities, and less insertion loss in comparison with conventionally designed switches. The broadband microstripline-based T/R switch is intended to transmit and receive wide-frequency signals to and from multi-tuned MRI RF coil(s). The wide frequency range frequencies cover many atomic nuclei (X-nuclei), including 23Na, 31P, 19F, 13C, 7Li, and 1H, when these atomic nuclei are exposed to 7 Tesla magnetic field strength in an MRI machine. The disclosed broadband multi-resonance T/R switch eliminates the need for any type of tuning to cover the aforementioned X-nuclei. Further, the disclosed T/R switch does not exceed a realistic trace width of microstriplines that determines an allowable amount of increase in temperature when exposed to 1 KW of power and 10% duty cycles of the radio frequency (RF) pulses. The disclosed T/R switch is configured to insert the RF pulses that correspond to different X-nuclei signals with low return loss values (−15 to −27 dB) and a low insertion loss (from −0.64 to −1.29 dB) and a very good isolation, which amounts to −70 dB.

In various aspects of the disclosure, non-limiting definitions of one or more terms that will be used in the document are provided below.

A term "microstripline" is an electrical transmission line that is used to carry Electro-Magnetic Waves (EM waves) or microwave frequency signals. The microstripline includes 3 (three) layers namely: a conducting strip, a dielectric layer, and a ground plane.

FIG. 1 is an exemplary schematic diagram of a radiofrequency (RF) assembly 100 for a magnetic resonance imaging (MRI) system or apparatus. As shown in FIG. 1, the RF assembly 100 includes various components such as an MRI RF coil 102, a multi-resonance transmit/receive (T/R) switch 104, a RF amplifier 106, and a pre-amplifier 108.

The T/R switch 104 is an electrical component for directing an RF signal power from an RF amplifier 106 to the RF coil 102, and a low power RF signal (also known as nuclear magnetic resonance signal (NMR) signal) from the RF coil 102 to a pre-amplifier 108 (also known as receiver). The T/R switch 104 is designed to protect the pre-amplifier 108 from damages caused by high power RF signal transmission while allowing the RF signal from the RF coil 102 to be passed undistorted and undiminished to the pre-amplifier 108. The T/R switch 104 may include four ports connected to various components. In one embodiment, the T/R switch 104 is electrically coupled to the RF amplifier 106 at a first port, the RF coil 102 at a second port, and the pre-amplifier 108 at a fourth port. A third port is connected to an RF terminator. In some embodiments, the third port may be terminated internally to the T/R switch 104. The T/R switch 104 may be designed using double sided microstripline based hybrid couplers as described in detail in subsequent figures. The RF amplifier 106 (also known as RF power amplifier) is an RF signal generating unit. The pre-amplifier 108 is a circuit configured to process signals received from the RF coil 102.

In operation, during an RF transmission, an RF signal power is provided by the RF amplifier 106. In some embodiments, the RF signal power generated may be in order of several thousand Watts. In some embodiments, the RF signal power required may be determined by a strength of a magnetic field to be applied on the subject. For example, the RF signal power may be proportional to a square of field strength. The generated RF signal power is directed through the T/R switch 104 to the RF coil 102. The RF coil 102 may transmit the RF signal power to the subject. In some implementations, the RF signal power is generated as a series of discrete RF pulses (known as pulsed RF signal power). The subject to which the RF signal is transmitted may respond by emitting an RF signal. The emitted RF signals may be received by the RF coil 102 at the second port and directed to the pre-amplifier 108 through the fourth port. Any additional signals or unwanted reflections are absorbed by the RF terminator at the third port. The RF amplifier 106, the pre-amplifier 108, the T/R switch 104, the RF coil 102 and the RF terminator are part of the MRI apparatus, among other components which are not shown and described herein for the sake of brevity.

A conventional MRI system includes a main magnet that generates a temporally uniform $B_0$ field (static magnetic field) through an examination region. The static magnetic field is configured to orient the magnetic spins of the nuclei of a subject positioned in the examination region. The main magnet can be an annular or bore-type magnet, a C-shaped open magnet, other designs of open magnets, or the like. Furthermore, at least one magnetic field gradient system is used for generating gradient magnetic fields for spatially encoding magnetic resonance signals of spins of nuclei. In an aspect, the at least one magnetic field gradient system includes gradient amplifiers and gradient magnetic coils. The gradient magnetic field coils are disposed adjacent to the main magnet to cause gradient magnetic fields across the temporally constant $B_0$ magnetic field.

The RF assembly 100 is disposed adjacent to an examination region. The MRI RF coil 102 may be configured to generate RF pulses (RF signals) for exciting magnetic resonance in the aligned dipoles of the subject positioned in the examination region. In one embodiment, the MRI RF coil 102 may include one or more separate transmitter coils or receiver coils. During an MRI scan, RF pulses generated by the MRI RF coil 102 induce a $B_1$ field. The applied gradient fields and $B_1$ field disturb the effective local magnetic field, resulting in the excitation of at least some of the nuclear spins. The excited nuclear spins emit RF signals that are detected by the MRI RF coil 102. The MRI RF coil 102 is configured to transmit and receive signals of different frequencies. Each frequency is set to be in resonance with a speed of precession of the targeted protons and neutrons inside each type of atomic nucleus. The MRI RF coil 102 is connected to the multi-resonance T/R switch 104. In an aspect, the MRI RF coil 102 may function as an antenna for transmitting RF signals and receiving signals from the subject positioned in the examination region. The MRI RF coil 102 may be controlled using the multi-resonance T/R switch 104.

The multi-resonance T/R switch 104 is commutatively coupled to the MRI RF coil 102, the RF amplifier 106, and the pre-amplifier 108. The multi-resonance T/R switch 104 is configured to protect the pre-amplifier 108 (receiver) from damage due to the high RF power of the MRI system during a transmit mode. In an aspect, a number of PIN diodes are put into the path between a transmit port (RF amplifier 106) and the pre-amplifier 108 so that no noise is coupled from the transmit port to the pre-amplifier 108 in a receive mode. The multi-resonance T/R switch 104 is configured to switch between the transmit/receive signals (of the different frequencies) to/from the MRI RF coil (s) 102, respectively. The multi-resonance T/R switch 104 is an electrical component for directing an amplified RF signal from the RF amplifier 106 to the MRI RF coil 102, during the transmit mode. During the receive mode, the multi-resonance T/R switch 104 is configured to direct a low-power RF signal (also known as a nuclear magnetic resonance signal (NMR) signal) from the MRI RF coil 102 to the pre-amplifier 108 (also known as a receiver). The multi-resonance T/R switch 104 is designed to protect the pre-amplifier 108 from any damage caused by high power RF signal transmission while allowing the RF signal from the MRI RF coil 102 to be passed undistorted and undiminished to the pre-amplifier 108. In an aspect, the multi-resonance T/R switch 104 may include four ports (not shown) connected to various components. The multi-resonance T/R switch 104 is electrically coupled to the RF amplifier 106 at a first port, the MRI RF coil 102 at a second port, and the pre-amplifier 108 at a fourth port. A third port (not shown) is connected to an RF terminator (not shown). In some embodiments, the third port may be terminated internally to the multi-resonance T/R switch 104. The multi-resonance T/R switch 104 may be designed using double-sided microstripline based couplers as described in detail in subsequent figures. In one example, the multi-resonance T/R switch 104 may be implemented using a folded prototype.

The RF amplifier 106 (also known as an RF power amplifier) is an RF signal generating unit. The pre-amplifier 108 is a circuit configured to process signals received from the MRI RF coil 102. In operation, during the transmit mode (RF transmission), the RF signal power is provided by the RF amplifier 106. In some embodiments, the RF signal power generated by the RF amplifier 106 may be in the order of several thousand Watts. In some embodiments, the RF signal power required may be determined by a strength of the magnetic field to be applied to the subject. For example, the RF signal power may be proportional to a square of field strength. The generated RF signal power is directed through the multi-resonance T/R switch 104 towards the MRI RF coil 102. MRI The RF coil 102 may also transmit the RF signal power to the subject. In some implementations, the RF signal power is generated as a series of discrete RF pulses (known as pulsed RF signal power). The subject to which the RF signal is transmitted may respond back by emitting a RF signal. The emitted RF signals may be received by the MRI RF coil 102 at the second port and directed to the pre-amplifier 108 through the fourth port. Any additional signals or unwanted reflections are absorbed by the RF terminator at the third port. The RF amplifier 106, the pre-amplifier 108, the multi-resonance T/R switch 104, the MRI RF coil 102, and the RF terminator are part of the MRI assembly 100, among other components which are not shown and described herein for the sake of brevity.

Figure 2A:
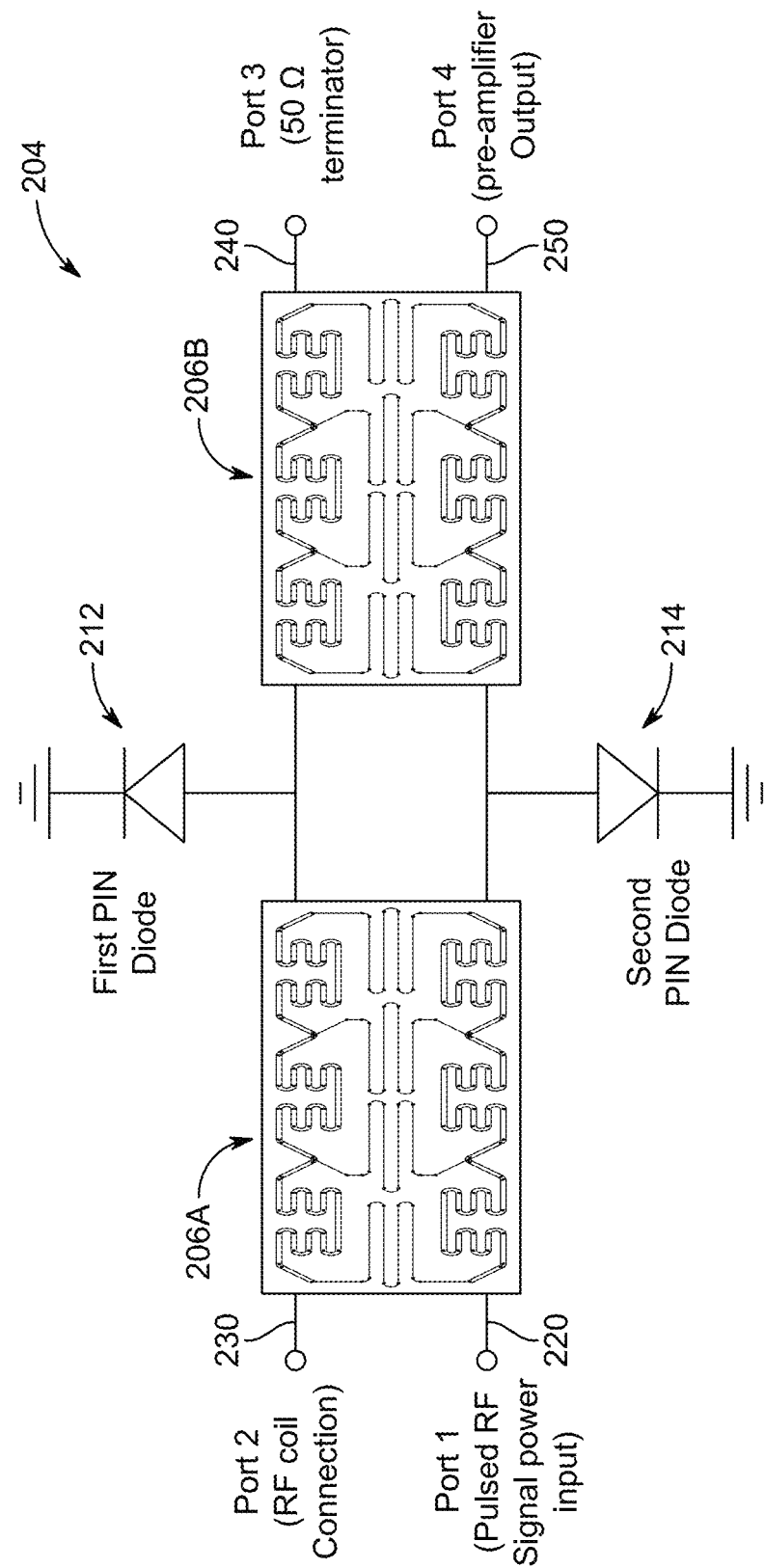
FIG. 2A is a block diagram of a multi-resonance transmit/receive (T/R) switch having a four-branch hybrid coupler, according to certain embodiments.

Referring to FIG. 2A, a block diagram of a multi-resonance T/R switch 204 is described. The multi-resonance T/R switch 204 includes a microstripline based hybrid coupler that is a double-sided microstripline based coupler. For understanding the operation of the multi-resonance T/R switch 204, the microstripline based hybrid coupler is shown in two parts namely: a first microstripline based hybrid coupler 206A (a top side of the microstripline based hybrid coupler), and a second microstripline based hybrid coupler 206B (a bottom side of the microstripline based hybrid coupler). Along with the double-sided microstripline-based coupler, the multi-resonance T/R switch 204 also includes a first PIN diode 212, and a second PIN diode 214. As shown in FIG. 2, the multi-resonance T/R switch 204 has four ports (a first port 220, a second port 230, a third port 240, and a fourth port 250). The first port 220 and the second port 230 are associated with the first microstripline based hybrid coupler 206A. The third port 240 and the fourth port 250 are associated with the second microstripline based hybrid coupler 206B. In an example, the first port 220 is coupled to the RF amplifier 106. The second port 230 is connected to the MRI RF coil 102. The third port 240 is connected to an RF terminator (not shown). The fourth port 250 is connected to the pre-amplifier 108.

In an aspect, the first microstripline based hybrid coupler 206A and the second microstripline based hybrid coupler 206B may have similar configuration, shape, size, and functions. In another aspect, the first microstripline based hybrid coupler 206A and the second microstripline based hybrid coupler 206B may have different configuration, shape, size, and functions. In an aspect, the top side of the microstripline based hybrid coupler and the bottom side of the microstripline based hybrid coupler are rectangular in shape. In some examples, the top side of the microstripline based hybrid coupler and the bottom side of the microstripline based hybrid coupler are of equal sizes.

The first microstripline based hybrid coupler 206A is configured to connect to the first port 220 configured to receive a pulsed RF signal power as an input signal from the RF amplifier. The first microstripline based hybrid coupler 206A is configured to connect to the second port 230 which is connected to the MRI RF coil (not shown) to output the pulsed RF signal power. The first microstripline based hybrid coupler 206A and the second microstripline based hybrid coupler 206B are electrically connected with the first PIN diode 212 and the second PIN diode 214.

When the MRI apparatus is working in a transmit mode (as a transmitter), the pulsed RF signal power is supplied (injected) to the first port 220. During the transmit mode, the first PIN diode 212 and the second PIN diode 214 are forward biased. As the first PIN diode 212 and the second PIN diode 214 are forward biased, the supplied RF signal power is reflected to the second port 230. The MRI RF coil coupled to the second port 230 receives the pulsed RF signal power and transmits the pulsed RF signal power to the subject.

When the MRI apparatus is working in a receive mode (acting as a receiver), then the first PIN diode 212 and the second PIN diode 214 are reverse biased. The MRI RF coil is configured to detect the signal emanated by the subject. The RF signal detected at the MRI RF coil from the subject is obtained at the second port 230. From the second port 230, the detected RF signal is passed through the two couplers (the first microstripline based hybrid coupler 206A and the second microstripline based hybrid coupler 206B) and delivered to the fourth port 250. Any unbalanced signals are terminated at the RF terminator at the third port 240. In an example, the RF terminator is a 50Ω terminator.

The multi-resonance T/R switch 204 is optimized to receive RF pulses of different frequencies that are transmitted to and received from the MRI RF coil, where the different frequencies are received concurrently and without tuning by the multi-resonance T/R switch 204 from the MRI RF coil.

Figure 2B:
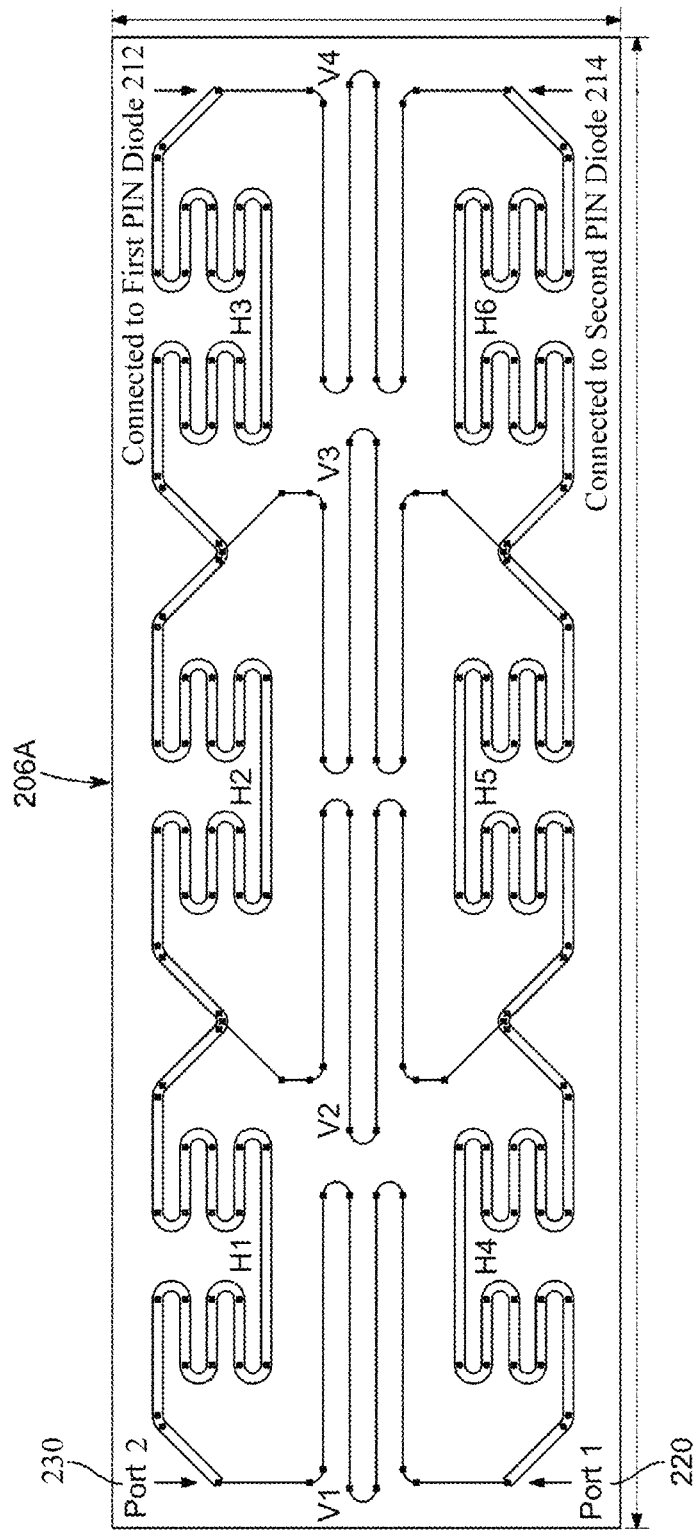
FIG. 2B is a top side circuit diagram of the four-branch coupler, according to certain embodiments.

FIG. 2B shows the circuit diagram of a top side a four-branch microstripline based hybrid coupler (hereinafter interchangeably referred to as "four-branch hybrid coupler"). In an aspect, a bottom side of the four-branch hybrid coupler has similar geometry of the top side of the four-branch hybrid coupler.

In an example, the four-branch hybrid coupler includes four branches. The ground planes of the top side of the four-branch hybrid coupler and the bottom side of the four-branch hybrid coupler are connected. In an implementation, the top side, and the bottom side of the multi-resonance T/R switch 204 are rectangular in shape. In an example, the top side and the bottom side of the multi-resonance T/R switch 204 are of equal sizes. In some examples, the top side and the bottom side of the multi-resonance T/R switch 204 are of different sizes. Also, in some embodiments, the top side, and the bottom side of the multi-resonance T/R switch 204 may be of a same shape. In some embodiments, the top side, and the bottom side of the multi-resonance T/R switch 204 may be of different shapes. In an example, a length of the MSL based four-branch hybrid coupler is less than 540 mm and a width of the MSL based four-branch hybrid coupler is less than 175 mm.

In an aspect, the top side of the four-branch hybrid coupler may be divided into two sections namely: an upper top side and a lower top side that are a mirror image of each other. Similarly, the bottom side of the four-branch hybrid coupler may be divided into two sections namely: an upper bottom side and a lower bottom side that are a mirror image of each other.

As shown in FIG. 2B, the multi-resonance T/R switch 204 includes four vertical transmission lines (V1, V2, V3, and V4) and six horizontal transmission lines (H1, H2, H3, H4, H5, and H6). To reduce the size of the four-branch hybrid coupler, empty places inside the four-branch hybrid coupler have been adjusted, and each transmission line has been designed in a bended manner. The four vertical transmission lines (V1, V2, V3, and V4) are arranged in the bended manner on the microstripline-based hybrid coupler. Also, the six horizontal transmission lines (H1, H2, H3, H4, H5 and H6) are arranged in the bended manner on the microstripline based hybrid coupler. For example, a length of at least one of the transmission lines is between 55 cm and 105 cm. In an aspect, the length of all transmission lines of the four-branch hybrid coupler is a quarter wavelength.

The multi-resonance T/R switch 204 is configured to operate in the transmit mode and the receive mode. In the transmit mode, the four vertical transmission lines (V1, V2, V3 and V4) and the six horizontal transmission lines (H1, H2, H3, H4, H5 and H6) at the top side of the T/R switch 204 are activated, while the vertical transmission lines (V1, V2, V3 and V4) and horizontal transmission lines (H1, H2, H3, H4, H5 and H6) at the bottom side of the T/R switch 204 are kept inactive. The top side of the four-branch hybrid coupler (which corresponds to the first microstripline based hybrid coupler 206A, as mentioned above) is associated with the first port 220 and the second port 230. The top side of the four-branch hybrid coupler, i.e., the first microstripline based hybrid coupler 206A, is electrically connected to the first PIN diode 212 and the second PIN diode 214.

The bottom side of the four-branch hybrid coupler (which corresponds to the second microstripline based hybrid coupler 206B, as mentioned above) is associated with the third port 240 and the fourth port 250. The bottom side of the four-branch hybrid coupler, i.e., the second microstripline based hybrid coupler 206B, is also electrically connected with the first PIN diode 212 and the second PIN diode 214.

In some examples, the multi-resonance T/R switch 204 has a height between 1.4 mm and 1.7 mm. The multi-resonance T/R switch 204 has relative permittivity between 2.42 and 2.68. In an aspect, the microstripline of the multi-resonance T/R switch 204 has a threshold trace width of 0.55 mm. In an operative example, for the four-branch hybrid coupler-based T/R switch 204, the width of outer branches (the narrowest branches) is equal to 0.43 mm. The four-branch hybrid coupler-based T/R switch 204 may be configured to handle RF signal with a power rate 1 kW and 10% duty cycle. In an exemplary aspect, the four-branch hybrid coupler-based T/R switch 204 has been designed at 100 MHz on Rogers substrate, manufactured by Rogers Corporation (located at 1 Technology Dr. Rogers, CT, 06263, United States of America) under a brand RO 4725 JXR, having relative permittivity 2.55 and height of 1.542 mm.

Figure 3A:
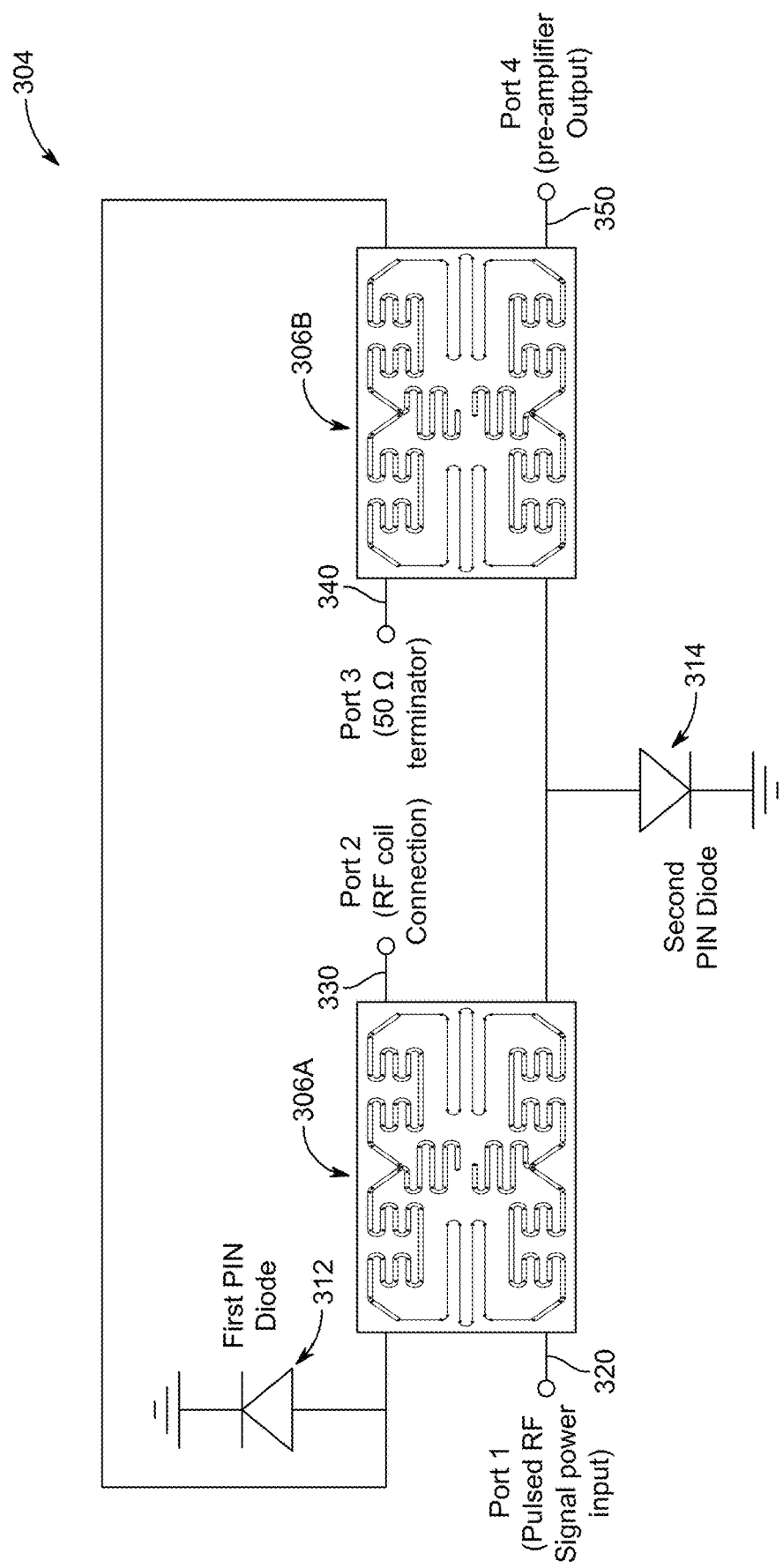
FIG. 3A is a block diagram of a multi-resonance T/R switch having a two-section branch-line hybrid coupler, according to certain embodiments.

FIG. 3A is a circuit diagram of a multi-resonance T/R switch 304 having a two-section branch-line hybrid coupler. In an aspect, the two-section branch-line hybrid coupler is a MSL based hybrid coupler. The multi-resonance T/R switch 304 includes a first MSL based hybrid coupler 306A (a top side of the two-section branch-line hybrid coupler), a second MSL based hybrid coupler 306B (a bottom side of the two-section branch-line hybrid coupler), an inverter 310 (shown in FIG. 3B), two PIN diodes (a first PIN diode 312, a second PIN diode 314), and four ports (a first port 320, a second port 330, a third port 340, and a fourth port 350).

In an implementation, the top side of the two-section branch-line hybrid coupler 306A and the bottom side of the of the two-section branch-line hybrid coupler 306B are rectangular in shape. In an example, the top side of the two-section branch-line hybrid coupler 306A and the bottom side of the two-section branch-line hybrid coupler 306B are of equal sizes. In some examples, the top side of the two-section branch-line hybrid coupler 306A and the bottom side of the two-section branch-line hybrid coupler 306B are of different sizes. Also, in some embodiments, the top side of the two-section branch-line hybrid coupler 306A and the bottom side of the two-section branch-line hybrid coupler 306B may be of the same shape. In some embodiments, the top side, and the bottom side of the MSL based hybrid coupler may be of different shapes. In an example, a length of the two-section branch-line hybrid coupler is less than 410 mm, and a width of the microstripline-based hybrid coupler is less than 190 mm.

Each of the two-section branch-line hybrid coupler (306A, 306B) includes three vertical transmission lines (V1, V2 and V3) arranged in a bended manner, and four horizontal transmission lines (H1, H2, H3 and H4) arranged in a bended manner on the MSL based hybrid coupler. The inverter 310 is electrically connected to the middle vertical transmission line (V2).

The four ports are located on the top side and the bottom side of the MSL based hybrid coupler. Each of the PIN diodes (the first PIN diode 312, the second PIN diode 314) is electrically connected to the top side and the bottom side of the MSL based hybrid coupler.

In an implementation, the MSL based hybrid coupler receives RF pulses of different frequencies on one of the ports and transmits the RF pulses to the MRI RF coil through the second port 330. The MSL based hybrid coupler is configured to receive and transmit different frequencies are transmitted and received concurrently and without tuning by the multi-resonance T/R switch 306 to and from the MRI RF coil. The MSL based hybrid coupler is configured to accept RF radio pulses on one of the ports and transmit RF signals through another port to the MRI RF coil.

For example, when the MRI apparatus is working in the transmit mode, then the pulsed RF signal power is supplied (injected) to the first port 320. During the transmit mode, the first PIN diode 312, and the second PIN diode 314 are forward biased. As the first PIN diode 312, and the second PIN diode 314 are forward biased, the supplied RF signal power is reflected to the second port 330. The MRI RF coil is coupled to the second port 330. The second port 330 receives the pulsed RF signal power and transmits the pulsed RF signal power to the subject.

When the MRI apparatus is working in the receive mode, the first PIN diode 312 and the second PIN diode 314 are reverse biased. The detected RF signal is received at the MRI RF coil from the subject is obtained at the second port 330. From the second port 330, the received RF signal is passed through the two hybrid couplers (306A, 306B) and is delivered at the fourth port 350. Any unbalanced signals are terminated at the RF terminator at the third port 340. In one example, the multi-resonance T/R switch 304 may be implemented using a folded prototype.

In an example, the MSL based hybrid coupler (306A, 306B) includes two sections. In an aspect, the top side of the two-section branch-line hybrid coupler 306A may be divided into two sections: an upper top side and a lower top side that are mirror image to each other. Similarly, the bottom side of the two-section branch-line hybrid coupler 306B may be divided into two sections namely: an upper bottom side and a lower bottom side that are mirror image to each other. Both hybrid couplers (306A, 306B) are connected to each other at two ports: the "through ports" and the "coupled ports". In the transmit mode, the two PIN diodes which are connected at the through port and the coupled port of the first coupler 306A (left section of the two-section branch-line hybrid coupler), are forward biased. In this case, all the input signals are to be delivered to the MRI RF coil at the second port 330. In the receive mode, both PIN diodes are reverse biased, and the detected RF signal from MRI RF coil at second port 330 is to be delivered to fourth port 350.

In an aspect, the inverter 310 is electrically connected to the middle vertical transmission line (V2). For example, two short coaxial cables are used to operate as the inverter 310 at the middle vertical transmission line V2 of each two-section branch-line hybrid coupler. In some examples, a 180 deg. phase shift can be achieved by replacing the straight connection of the coaxial cable by a crossover connection of the coaxial cable.

Figure 3B:
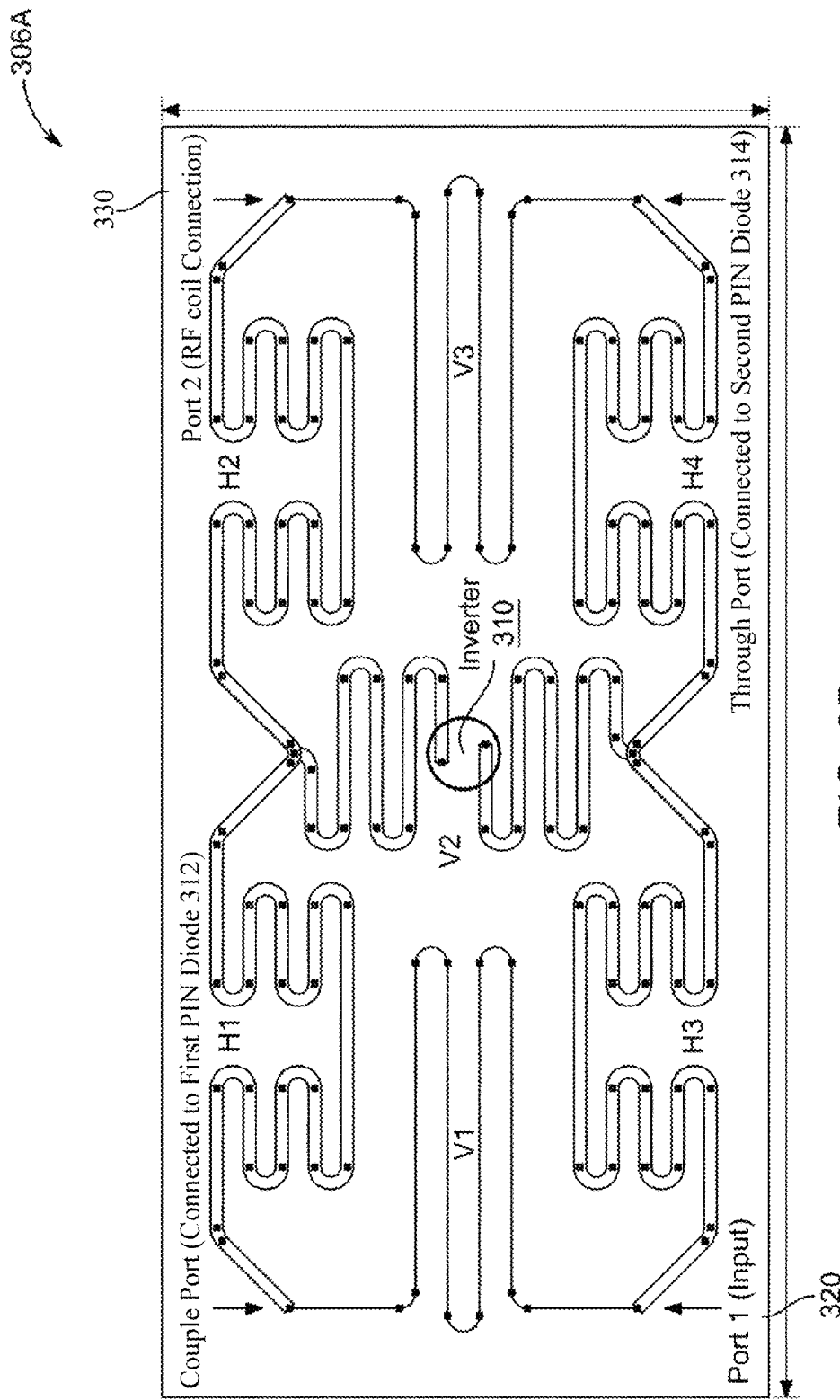
FIG. 3B is a top side circuit diagram of the two-section branch-line hybrid coupler, according to certain embodiments.

FIG. 3B is a block diagram of the two-section branch-line hybrid coupler 306A. As shown in FIG. 3B, the two-section branch-line hybrid coupler 306A includes three vertical transmission lines (V1, V2 and V3) and four horizontal transmission lines (H1, H2, H3 and H4). To reduce the size of the two-section branch-line hybrid coupler 306A, the empty places inside the two-section branch-line hybrid coupler 306A have been optimized and each transmission line has been designed in a bended manner. The three vertical transmission lines (V1, V2 and V3) are arranged in a bended manner on the microstripline hybrid coupler. Also, the four horizontal transmission lines (H1, H2, H3, and H4) are arranged in a bended manner on the microstripline hybrid coupler. For example, a length of at least one of the transmission lines is between 55 cm and 105 cm. In an aspect, the length of all transmission lines of the four-branch coupler is a quarter wavelength. In an aspect, the length for all the transmission lines is the same.

The multi-resonance transmit/receive (T/R) switch 304 is configured to operate in the transmit mode and the receive mode. In the transmit mode, the three vertical transmission lines (V1, V2 and V3) and four horizontal transmission lines (H1, H2, H3 and H4) at the top side of the two-section branch-line hybrid coupler 306A are activated, while the three vertical transmission lines (V1, V2 and V3) and four horizontal transmission lines (H1, H2, H3 and H4) at the bottom side of the two-section branch-line hybrid coupler 306B are kept inactive.

The top side of the two-section branch-line hybrid coupler 306A is associated with the first port 320 and the second port 330. The top side of the two-section branch-line hybrid coupler 306A is electrically connected to the first PIN diode 312 and the second PIN diode 314.

The bottom side of the two-section branch-line hybrid coupler 306B is associated with the third port 340 and the fourth port 350. The bottom side of the two-section branch-line hybrid coupler 306B is also electrically connected with the first PIN diode 312 and the second PIN diode 314.

The inverter 310 has been inserted at the middle vertical transmission line to enhance the bandwidth. For example, the inverter 310 is a 180 deg. phase shifter.

In an aspect, the characteristic impedance for the horizontal transmission lines (H1, H2, H3 and H4) and vertical middle transmission line V2 is $Z_o$. Further, the characteristic impedance for the vertical transmission lines (V1, V3) is $2 \times Z_o$.

In an exemplary aspect, the two-section branch-line hybrid coupler has been designed on a Rogers substrate, manufactured by Rogers Corporation (located at 1 Technology Dr Rogers, CT, 06263, United States of America) under a brand RO 4725 JXR, having relative permittivity 2.55 and height of 1.542 mm. In an aspect, the dimensions of the two-section branch-line hybrid coupler are 400 mm×180 mm.

In an example, the input RF signal is inserted into the first port 320. The second port 330 (though port) and fourth port (coupled port) 350 have −3 dB quadrature outputs. The third port 340 is the isolated port.

Figure 4:
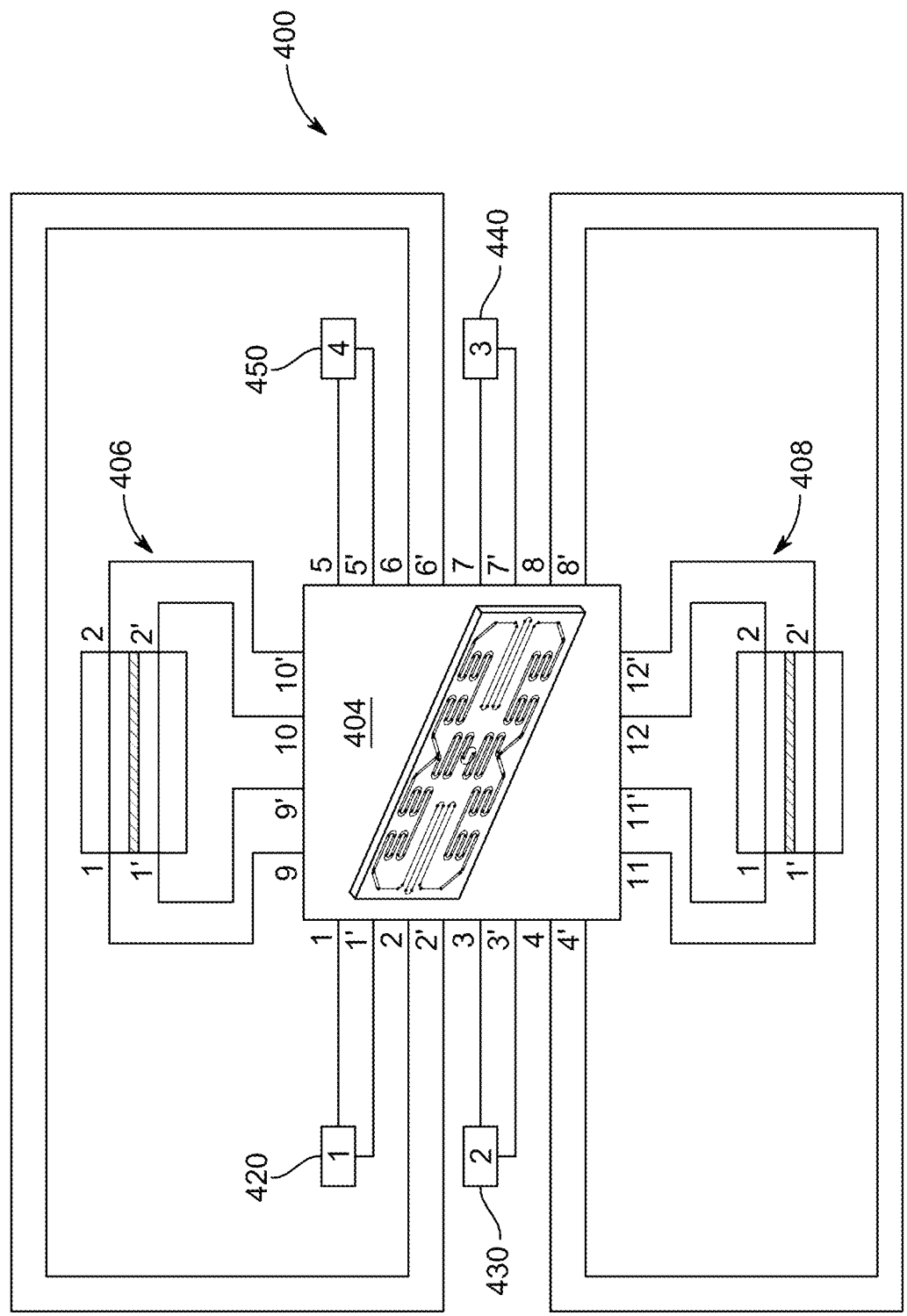
FIG. 4 is a connection diagram of the multi-resonance T/R switch having the two-section branch-line hybrid coupler having ports and the two inverters, according to certain embodiments.

FIG. 4 is a connection diagram 400 of the multi-resonance T/R switch 404 having the two-section branch-line hybrid coupler. As shown in FIG. 4, the multi-resonance T/R switch 404 has four ports (a first port 420, a second port 430, a third port 440, and a fourth port 450). In an example, the first port 420 is coupled to the RF amplifier 106. The second port 430 is connected to the MRI RF coil 102. The third port 440 is connected to an RF terminator (not shown). The fourth port 450 is connected to the pre-amplifier 108. Further, the multi-resonance T/R switch 404 has two inverters (406, 408). As shown in FIG. 4, a phase shift may be achieved by replacing a coaxial cable in crossover connection. The first coaxial cable (first inverter 406) is inserted between port 9 and 10 whereas the second coaxial cable (second inverter 408) is inserted between port 11 and 12.

Figure 5:
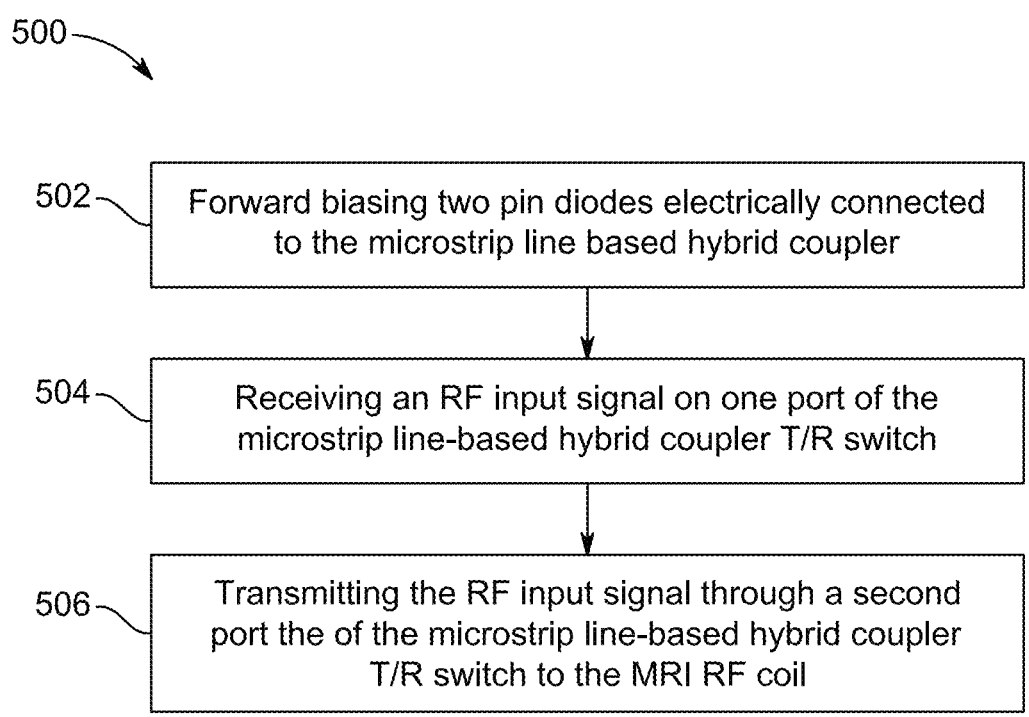
FIG. 5 is an exemplary flowchart for transmitting radio frequency to an MRI RF coil from a microstripline based hybrid coupler T/R switch, according to certain embodiments.

FIG. 5 is an exemplary flowchart 500 for transmitting radio frequency to an MRI RF coil from a microstripline-based hybrid coupler T/R switch 204, 304.

Step 502 includes forward biasing two PIN diodes (212, 214) electrically connected to the microstripline based hybrid coupler.

Step 504 includes receiving an RF input signal on one port of the microstripline-based hybrid coupler T/R switch 204, 304.

Step 506 includes transmitting the RF input signal through a second port 330 the of the microstripline-based hybrid coupler T/R switch 204, 304 to the MRI RF coil. In an aspect of the present disclosure, the RF input signal is transmitting in a range 74-130 MHz or a range 280-332 MHz to the MRI RF Coil.

In an aspect, the RF signal transmits through the microstripline based hybrid coupler with an insertion loss less than −0.64 dB.

In an aspect, the RF signal transmits through the microstripline based hybrid coupler with a return loss less than −15 dB.

Figure 6:
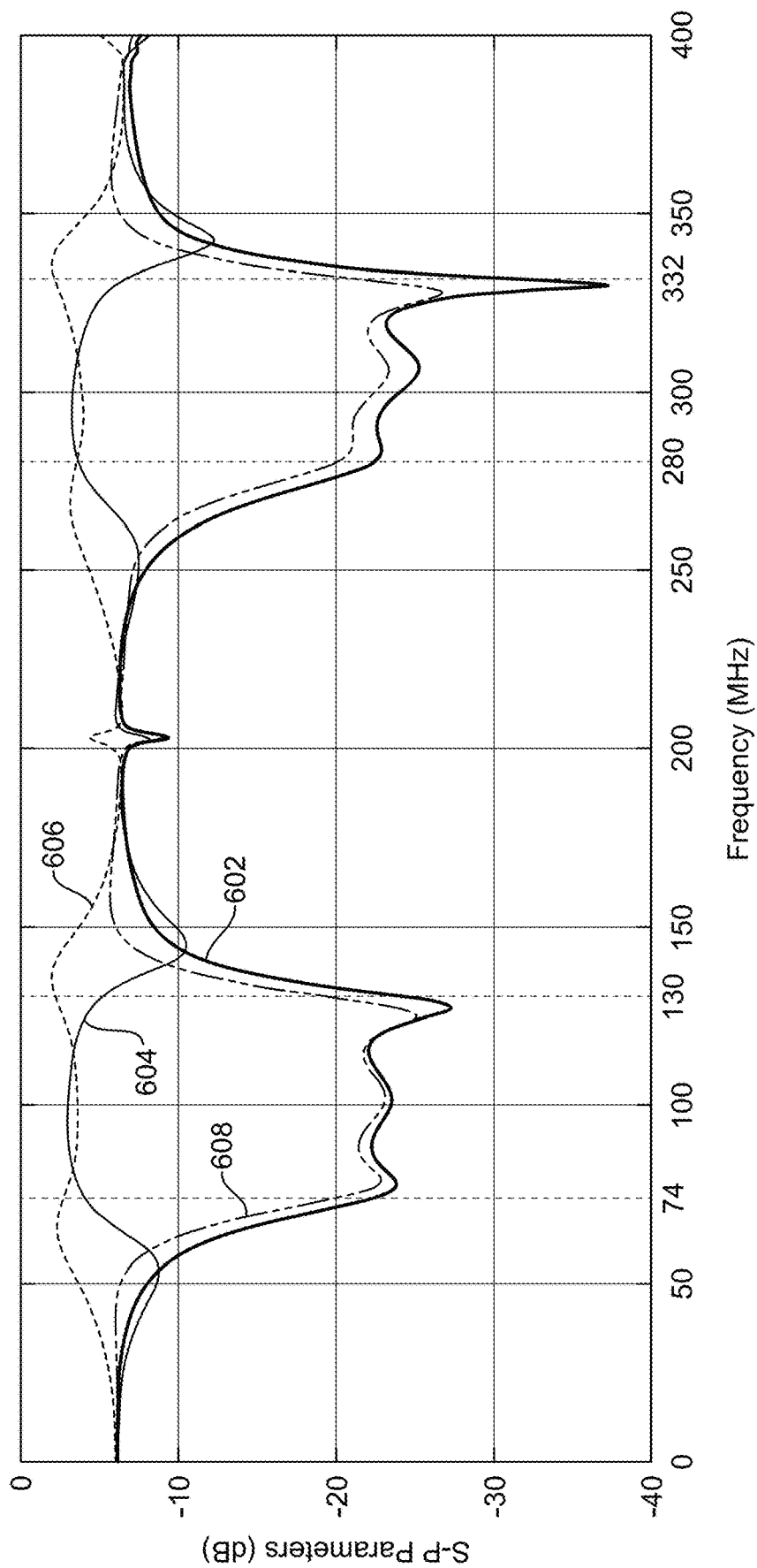
FIG. 6 is an exemplary graph showing S-parameters for the four-branch hybrid coupler, according to certain embodiments.
Figure 7:
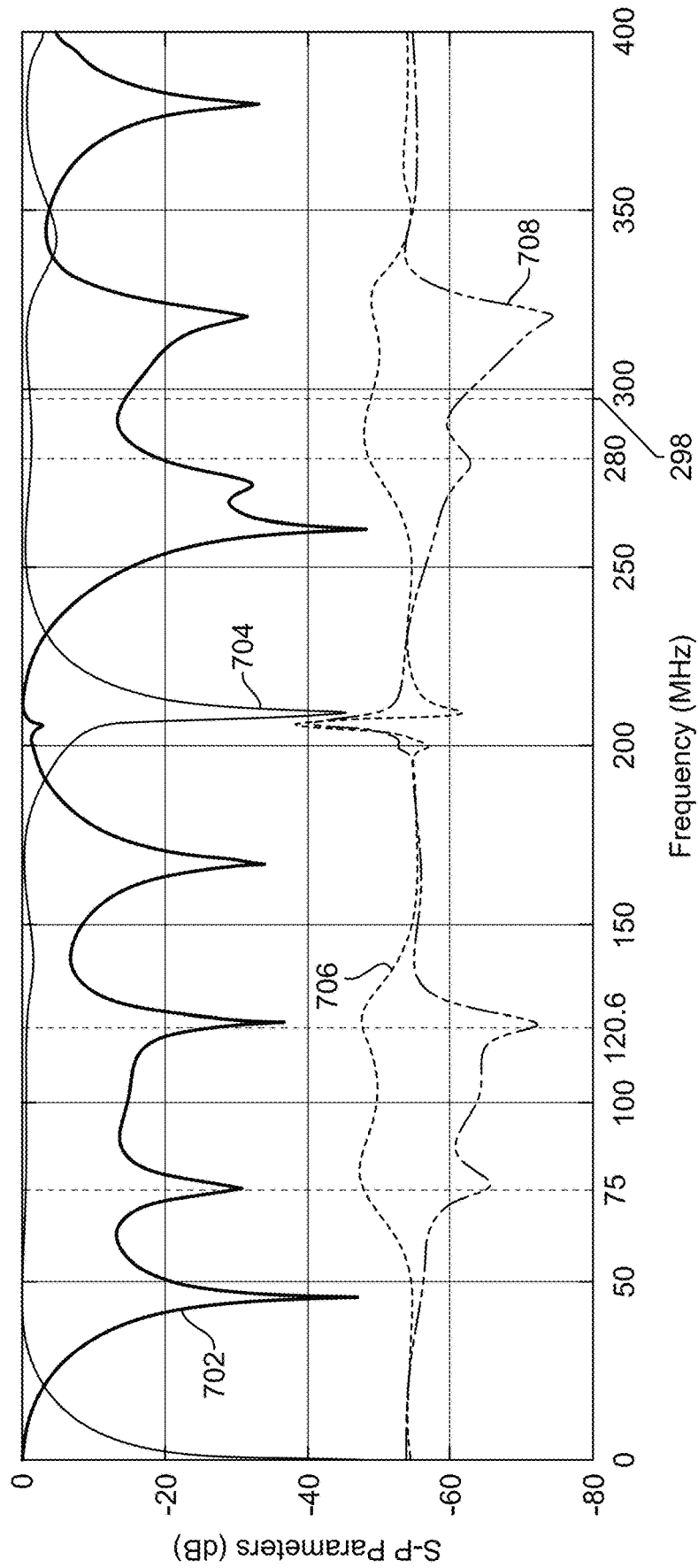
FIG. 7 is an exemplary graph illustrating S-parameters for the multi-resonance T/R switch having the four-branch hybrid coupler during a transmit mode, according to certain embodiments.

Simulation is performed on the schematic circuits shown in FIG. 2B, and resultant simulation S-parameters are illustrated in FIG. 6 and FIG. 7. FIG. 6 is an exemplary graph showing S-parameters for the four-branch hybrid coupler. During simulation, it was observed that the frequency bandwidth (less than −20 dB for return loss and isolation) of the hybrid coupler could be improved by increasing the number of branches. For a two-branch coupler, the bandwidth did not exceed 10%, whereas, for the three-branch coupler, the bandwidth did not exceed 39%. For a four-branch coupler, the bandwidth reached up to 60%. However, couplers with a greater number of branches are not recommended because the impedance value of the outer branches are very high and exceeding the upper limits of a practical realization. Therefore, four-branch coupler has been chosen to implement the broadband T/R switch 204 with the different line impedances. The four-branch hybrid coupler is configured to produce fundamental frequency and odd harmonics appear on the simulated S-parameters as shown in FIG. 6. The fundamental frequency appears at 100 MHz with a frequency range of 70.7 to 128.1 MHz, and the $3^{rd}$ odd harmonics appears at 300 MHz with frequency range of 274.5 to 312.3 MHz In an aspect, by working in above-mentioned two frequency ranges, the disclosed MRI apparatus is configured to cover most famous atomic nuclei at 7 Tesla MRI such as 23Na, 31P, 19F, 13C, 7Li, and the most prevalent element 1H. Curve 602 represents S11 parameter and curve 804 represents S21 parameter of the four-branch coupler. Curve 606 represents S31 parameter and curve 808 represents S41 parameter of the four-branch coupler.

FIG. 7 is a graph illustrating the simulated S-parameters for the multi-resonance T/R switch 204 having the four-branch hybrid coupler during the transmit mode. Curve 702 represents S11 parameter and curve 704 represents S21 parameter of the four-branch hybrid coupler. Curve 706 represents S31 parameter and curve 708 represents S41 parameter of the four-branch hybrid coupler. Low return loss (S11) and insertion loss (S21) have been obtained at all resonant frequencies of the major atomic nuclei used in MRI. The lowest insertion loss has been obtained at 75 MHz (13C atoms) whereas the highest value at 280.35 MHz (19F atoms). The disclosed MRI apparatus offers very good matching and high isolation during transmit. Within the first frequency band, around the fundamental center frequency 100 MHz, an insertion loss <−1 dB has been observed compared to the second band, around 300 MHz. Table 1 summarizes the S-parameter values for different atoms when the four-branch hybrid coupler is operated in the transmit mode.

TABLE 1

S-parameters for the T/R switch during the transmit mode

| Atomic Nuclei | Frequency (MHz) | S11 (dB) | S21 (dB) | S41 (dB) |
| --- | --- | --- | --- | --- |
| 13C | 75 | −26.7 | −0.64 | −63 |
| 23Na | 78.8 | −23.38 | −0.66 | −65.5 |
| 7Li | 115.8 | −17.4 | −0.67 | −65 |
| 31P | 120.6 | −23.78 | −0.73 | −69.7 |
| 19F | 280.35 | −20.5 | −1.29 | −62.8 |
| 1H | 298 | −14.8 | −1.22 | −62 |

Figure 8:
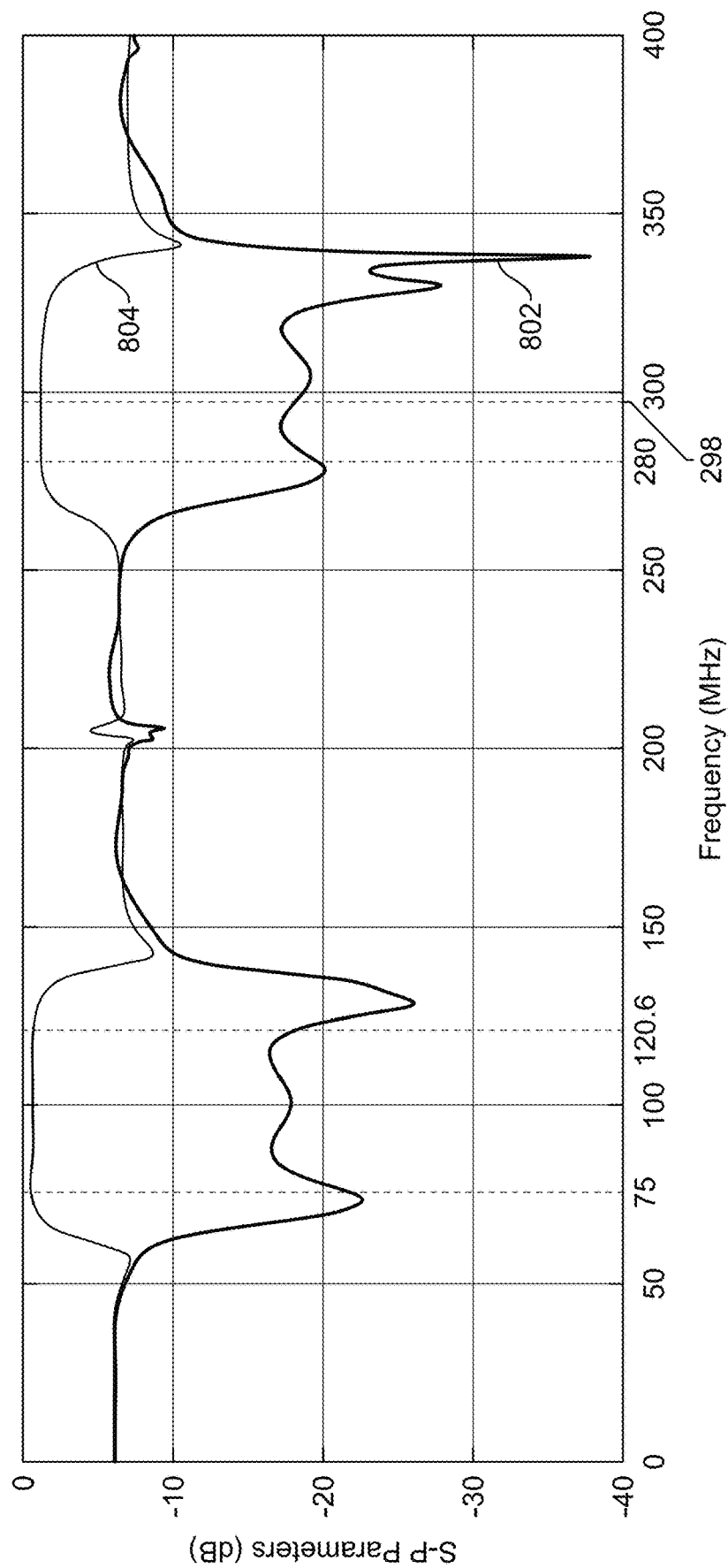
FIG. 8 is an exemplary graph illustrating S-parameters for the multi-resonance T/R switch having the four-branch coupler during a receive mode, according to certain embodiments.

FIG. 8 shows the simulated S-parameters for the multi-resonance T/R switch 204 having the four-branch hybrid coupler during the receive mode. Curve 802 represents S22 parameter and curve 804 represents S42 parameter of the four-branch hybrid coupler (206A, 206B). FIG. 8 shows low return loss (S11) and insertion loss (S21) have been obtained at all resonant frequencies of the major atomic nuclei used in MRI application. Table 2 summarizes the S-parameter values for different atoms when the four-branch hybrid coupler is operated in the receive mode. The lowest insertion loss has been obtained at 78.8 MHz (23Na atoms) whereas the highest value is at 280.35 MHz (19F atoms).

TABLE 2

S-parameters for the T/R switch during the receive mode

| Atomic Nuclei | Frequency (MHz) | S22 (dB) | S24 (dB) |
| --- | --- | --- | --- |
| 13C | 75 | −22.2 | −0.7 |
| 23Na | 78.8 | −19.6 | −0.58 |
| 7Li | 115.8 | −16.5 | −0.775 |
| 31P | 120.6 | −17.75 | −0.75 |
| 19F | 280.35 | −19.64 | −1.26 |
| 1H | 298 | −18.3 | −1.22 |

Figure 9:
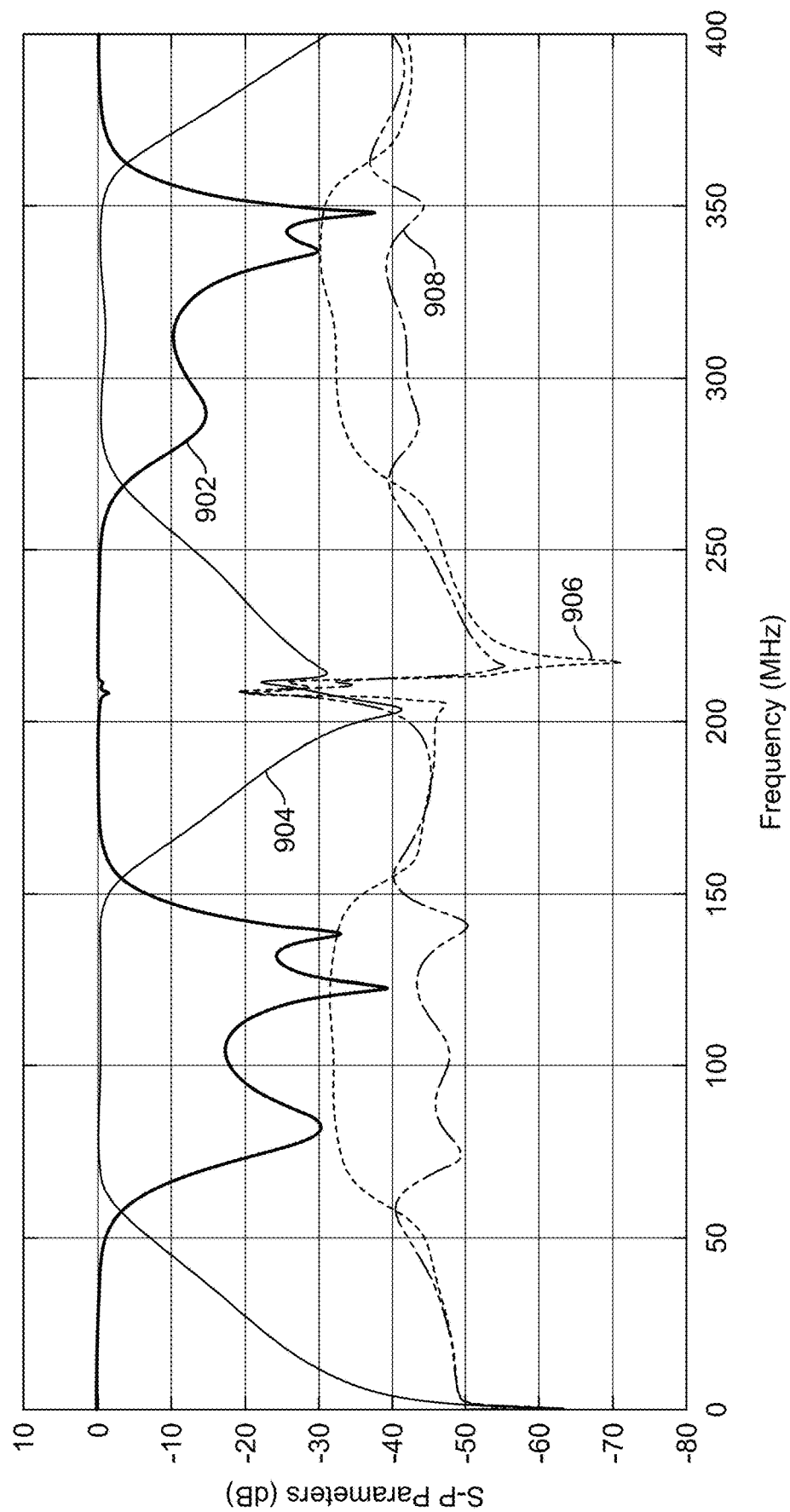
FIG. 9 is an exemplary graph showing S-parameters for the multi-resonance T/R switch having the two-section branch-line hybrid coupler during a transmit mode, according to certain embodiments.
Figure 10:
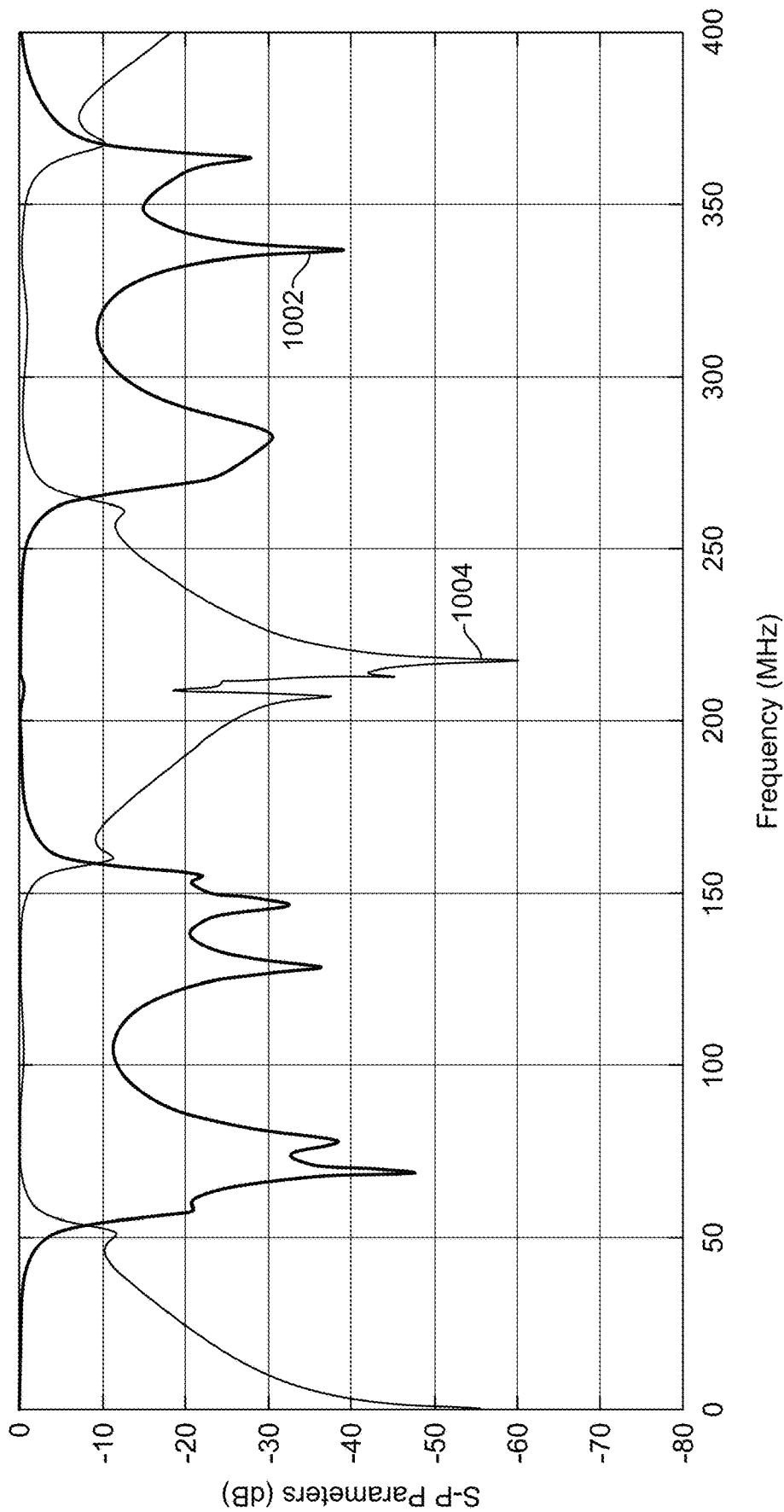
FIG. 10 is an exemplary graph showing S-parameters for the multi-resonance T/R switch having the two-section branch-line hybrid coupler during the receive mode, according to certain embodiments.

Simulation is performed on the schematic circuits shown in FIG. 3B, and resultant simulation S-parameters are illustrated in FIG. 9 and FIG. 10. FIG. 9 is an exemplary graph showing S-parameters for the multi-resonance T/R switch 304 having the two-section branch-line hybrid coupler during the transmit mode. Curve 902 represents S11 parameter and curve 904 represents S21 parameter of the two-section branch-line hybrid coupler. Curve 906 represents S31 parameter and curve 908 represents S41 parameter of the two-section branch-line hybrid coupler.

For the two-section branch-line broadband hybrid coupler-based T/R switch, the first operating band of the T/R switch 304 is extended from 66.2 MHz to 147.3 MHz whereas the second operating band is extended from 279.6 to 352.2 MHz. To evaluate the performance of the proposed two-section branch-line hybrid couplers based broadband T/R switch 304, S-parameters have been obtained from CST STUDIO SUITE (CST Studio Suite is a computational electromagnetics tool developed by Dassault Systèmes Simulia, located at 1301 Atwood Ave Ste 101W, Johnston, RI 02919). In the transmit mode, good matching (S11<−10 dB) and low insertion loss (S21<−1 dB) have been obtained at all atomic nuclei resonance frequencies, as shown in FIG. 9 and Table 3. In addition, high isolation (S41<−40 dB) between the transmitter and the receiver can be obtained. In the receive mode, good matching (S22<−13 dB) and low insertion loss (S21<−0.9 dB) have been obtained at all atomic nuclei resonance frequencies as shown in FIG. 9.

TABLE 3

S-parameters for two-section branch-line hybrid couplers based broadband T/R switch during the transmit mode

| Atomic Nuclei | Frequency (MHz) | S11 (dB) | S21 (dB) | S41 (dB) |
| --- | --- | --- | --- | --- |
| 13C | 75 | 23.2 | 0.25 | −50 |
| 23Na | 78.8 | 28.7 | 0.26 | −48 |
| 7Li | 115.8 | 22.6 | 0.38 | −45 |
| 31P | 120.6 | 32.1 | 0.35 | −44 |
| 19F | 280.35 | 11.2 | 0.92 | −42 |
| 1H | 298 | −13 | 0.74 | −42 |

FIG. 10 is an exemplary graph showing S-parameters for the multi-resonance T/R switch 304 having the two-section branch-line hybrid couplers during the receive mode. Curve 1002 represents S22 parameter, and curve 1004 represents S42 parameter of the four-branch coupler.

TABLE 4

S-parameters for two-section branch-line hybrid couplers based broadband T/R switch during the receive mode

| Atomic Nuclei | Frequency (MHz) | S22(dB) | S42 (dB) |
| --- | --- | --- | --- |
| 13C | 75 | 33.6 | 0.15 |
| 23Na | 78.8 | 37.14 | 0.12 |
| 7Li | 115.8 | 14.1 | 0.37 |
| 31P | 120.6 | 17.8 | 0.26 |
| 19F | 280.35 | −30 | 0.83 |
| 1H | 298 | 13.6 | 0.61 |

The presently disclosed multi-tuned switches 204, 304 are configured to transmit/receive RF pulses of different frequencies to/from multi-resonance RF coil(s) at the same time, and without tuning. If the coils can resonate at the same bands of multi-tuned switches 204 and 304, there is no need to change the type of the coil (during detection of different diseases) nor to move the patient. The present disclosed multi-tuned switches 204 and 304 minimize the artifacts, improving the quality of the scanned image and drastically reducing the costs.

The above-described hardware description is a non-limiting example of corresponding structure for performing the functionality described herein.

Numerous modifications and variations of the present disclosure are possible in light of the above teachings. It is therefore to be understood that within the scope of the appended claims, the invention may be practiced otherwise than as specifically described herein.

The invention claimed is:

1. A magnetic resonance imaging (MRI) apparatus, comprising:
a multi-resonance transmit/receive (T/R) switch, comprising:
a microstripline based hybrid coupler having a top plane at a top side and a bottom plane at a bottom side;
a first pin diode;
a second pin diode;
four vertical transmission lines arranged in a bended manner and six horizontal transmission lines arranged in a bended manner on the top plane of the microstripline based hybrid coupler; and
four vertical transmission lines arranged in a bended manner and six horizontal transmission lines arranged in a bended manner on the bottom plane of the microstripline based hybrid coupler;
wherein the top plane of the microstripline based hybrid coupler is associated with a first port and a second port, and electrically connected to an anode of the first pin diode and an anode of the second pin diode, the first port being coupled to a radio frequency (RF) amplifier, the second port being coupled to an MRI RF coil;
wherein the bottom plane is associated with a third port and a fourth port, and the bottom plane is electrically connected with the anode of the first pin diode and the anode of the second pin diode, the third port being coupled to an RF terminator, the fourth port being coupled to a pre-amplifier;
wherein a cathode of the first pin diode and a cathode of the second pin diode are electrically connected to ground;
wherein the multi-resonance transmit/receive (T/R) switch is configured to, during a transmit mode, place the first and second pin diodes in a forward biased state, such that RF pulses of different frequencies received from the RF amplifier coupled to the first port are directed to the MRI RF coil coupled to the second port, wherein the different frequencies are received concurrently and without tuning by the multi-resonance transmit/receive (T/R) switch from the MRI RF coil; and
wherein the multi-resonance transmit/receive (T/R) switch is configured to, during a receive mode, place the first and second pin diodes in a reverse biased state, such that RF signals detected by the MRI RF coil coupled to the second port are directed to the pre-amplifier coupled to the fourth port.

2. The magnetic resonance imaging (MRI) apparatus of claim 1, wherein a length of at least one transmission line is between 55 cm and 105 cm.

3. The magnetic resonance imaging (MRI) apparatus of claim 1, wherein the top plane and the bottom plane of the multi-resonance transmit/receive (T/R) switch are rectangular in shape.

4. The magnetic resonance imaging (MRI) apparatus of claim 1, wherein the top plane and the bottom plane of the multi-resonance transmit/receive (T/R) switch are of equal sizes.

5. The magnetic resonance image (MRI) apparatus of claim 1, wherein a length of the microstripline based hybrid coupler is less than 540 mm and a width of the microstripline based hybrid coupler is less than 175 mm.

6. The magnetic resonance imaging (MRI) apparatus of claim 1, wherein the microstripline based hybrid coupler has height between 1.4 mm and 1.7 mm.

7. The magnetic resonance imaging (MRI) apparatus of claim 1, wherein the microstripline based hybrid coupler has relative permittivity between 2.42 and 2.68.

8. The magnetic resonance imaging (MRI) apparatus of claim 1, wherein the microstripline of the multi-resonance transmit/receive (T/R) switch does not exceed a threshold trace width of 0.55 mm.

9. A magnetic resonance imaging (MRI) apparatus, comprising:
   a multi-resonance transmit/receive (T/R) switch, comprising:
      a microstripline (MSL) based hybrid coupler having a top plane at a top side and a bottom plane at a bottom side;
      two pin diodes;
      three vertical transmission lines arranged in a bended manner and four horizontal transmission lines arranged in a bended manner on the top plane of the MSL based hybrid coupler;
      three vertical transmission lines arranged in a bended manner and four horizontal transmission lines arranged in a bended manner on the bottom plane of the MSL based hybrid coupler;
      an inverter electrically connected to a middle vertical transmission line of the three vertical transmission lines on the top plane;
      an inverter electrically connected to a middle vertical transmission line of the three vertical transmission lines on the bottom plane;
   wherein the top plane of the MSL based hybrid coupler is associated with a first port and a second port, and electrically connected to anodes of the two pin diodes, the first port being coupled to a radio frequency (RF) amplifier, the second port being coupled to an MRI RF coil;
   wherein the bottom plane of the MSL based hybrid coupler is associated with a third port and a fourth port, and electrically connected to the anodes of the two pin diodes, the third port being coupled to an RF terminator, the fourth port being coupled to a pre-amplifier; and
   wherein cathodes of the two pin diodes are electrically connected to ground;
   wherein the MSL based hybrid coupler is configured to, during a transmit mode, place the two pin diodes in a forward biased state, such that RF pulses of different frequencies received from the RF amplifier coupled to the first port are directed to the MRI RF coil coupled to the second port, wherein the different frequencies are received concurrently and without tuning by the multi-resonance transmit/receive (T/R) switch from the MRI RF coil,
   wherein the MSL based hybrid coupler is configured to, during a receive mode, place the two pin diodes in a reverse biased state, such that RF signals detected by the MRI RF coil coupled to the second port are directed to the pre-amplifier coupled to the fourth port.

10. The magnetic resonance imaging (MRI) apparatus of claim 9, wherein the top plane and the bottom plane of the multi-resonance transmit/receive (T/R) switch are rectangular in shape and of equal sizes.

11. The magnetic resonance image (MRI) apparatus of claim 9, wherein a length of the microstripline based hybrid coupler is less than 410 mm and a width of the microstripline based hybrid coupler is less than 190 mm.

* * * * *